United States Patent [19]

Binnig et al.

[11] Patent Number: 4,550,257
[45] Date of Patent: Oct. 29, 1985

[54] NARROW LINE WIDTH PATTERN FABRICATION

[75] Inventors: Gerd K. Binnig, Richterswil, Switzerland; Randall M. Feenstra, Tarrytown; Rodney T. Hodgson, Ossining, both of N.Y.; Heinrich Rohrer, Richterswil, Switzerland; Jerry M. Woodall, Bedford Hills, N.Y.

[73] Assignee: International Business Machines Corporation, Armonk, N.Y.

[21] Appl. No.: 626,178

[22] Filed: Jun. 29, 1984

[51] Int. Cl.$^4$ .......................................... H01J 37/317
[52] U.S. Cl. ............................ 250/492.2; 250/423 F; 427/38; 118/723
[58] Field of Search ............ 250/492.2, 492.1, 423 F, 250/306; 427/286, 227, 38; 118/723, 50.1

[56] References Cited

U.S. PATENT DOCUMENTS

| 4,197,332 | 4/1980 | Broers et al. | 430/272 |
| 4,316,093 | 2/1982 | Broers et al. | 250/492.1 |
| 4,343,993 | 8/1982 | Binnig et al. | 250/306 |
| 4,382,186 | 5/1983 | Denholm et al. | 250/492.2 |

OTHER PUBLICATIONS

Physical Review Letters, vol. 49, No. 1, Jul. 5, 1982, p. 57—"Surface Studies by Scanning Tunneling Microscopy" by G. Binning et al.
J. Appl. Phys. 53(7), Jul. 1982, p. 5052—"On Tunneling in Metal-Oxide-Silicon Structures" by Weinberg.
Science vol. 220, No. 4592, Apr. 1983, p. 43—"IBM Images Surfaces by Electron Tunneling" by A. L. Robinson.
Physikalische Blatter 39(1983) No. 7, p. 176—"Einzelne Atome aufgelost mit dem Raster-Tunnel-Mikroskop (RTM)" by Binnig et al.

Primary Examiner—Alfred E. Smith
Assistant Examiner—Jack I. Berman
Attorney, Agent, or Firm—Alvin J. Riddles

[57] ABSTRACT

The formation of lines of the order of 8 Angstroms wide is achieved using a tunneling current through a gas that changes to provide a residue that is the basis of the line. The tunneling current energy is tuned to the energy required to dissociate the gas.

4 Claims, 2 Drawing Figures

NARROW LINE WIDTH PATTERN FABRICATION

DESCRIPTION

1. Technical Field

The trend toward narrower lines in pattern fabrication has been progressing rapidly in the integrated circuit and electronic apparatus field because as it becomes useful to increase both the number and complexity of devices allotted to an individual area, the physical sizes of both the devices and the interconnections must necessarily become smaller. At the present state of the electronic arts a line width dimension less than 50 Angstroms is a desirable goal.

2. Background Art

An electron beam used to alter the properties of a layer of resist material so that the region where the electron beam strikes the resist can be separated from the remainder of the resist for further processing has produced the narrowest line width patterns that have appeared thus far in the art.

A leading example of this type of art is U.S. Pat. No. 4,197,332 wherein an electron beam converts and fixes a pattern of resist having precise thickness and width dimensions on a thin film type member that is supported by an electron backscattering control substrate. This technique produces lines that are less than 100 Angstroms wide. There are, however, limits in the form of even further scattering problems connected with extending this type of technology so that line widths less than 50 Angstroms will be very difficult to achieve. In addition, the electron scattering control member is very thin and delicate.

DISCLOSURE OF THE INVENTION

Figure 1:
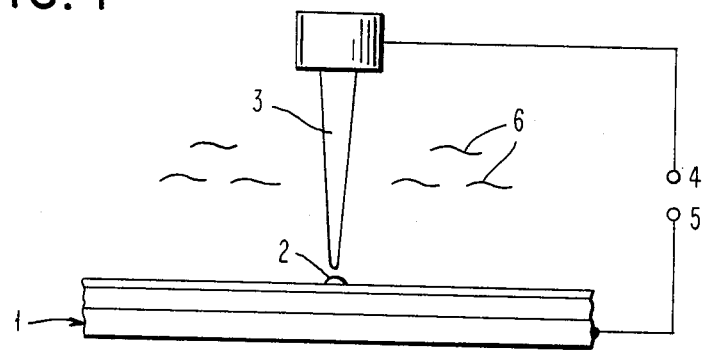
FIG. 1 is a schematic illustration of the apparatus for producing fine lines of the invention.

The invention is a simplified approach to fabrication of very narrow lines. The formation of fine, as small as 8 Angstroms wide, lines on a substrate is provided by the invention by changing the composition of a gas using a relatively low energy electron beam where the electron energy involved is just sufficient to change the gas composition. The electron energy involved is in the range of 1 electron volt to 100 electron volts and provides enough energy to accomplish the composition change without the risk of electron scattering from the surface. The current passes through the gas between a point that concentrates the electrons and the substrate. The gas is ambient in the vicinity and thus is in the space between the point and the substrate and adsorbed on the substrate.

A gas molecule can be decomposed or merely change composition when it is struck by an electron of sufficient energy so as to leave a residue that on further processing can be converted into lines.

For clarity of explanation, the case where the gas decomposes will be used as an example although in the light of the principles set forth other tunneling current-gas composition changes will be readily apparent to one skilled in the art.

A group of metal bearing gases can provide metal lines and organic molecular gases can provide carbon lines and common semiconductor dopant containing gases can provide semiconductor dopants.

The current for minimal linewidth is tuned to the minimum electron energy required for decomposition of the particular gas employed including a slight addition for system losses. A current from a stylus having a point of the order of 50 Angstroms radius can provide lines of the order of 80–100 Angstroms.

It has been found in accordance with the invention that a low energy, of the order of 5 electron volts, will excite the molecular states of organic and metal bearing gases and lead to the dissociation of the molecule. This amount of energy does not produce secondary and further cascade electrons which in turn operate to interfere with precise line definition.

Tunneling current from a point to a surface has been employed in the art to provide very close topographical information about a surface. The apparatus employing this principle has come to be known in the art as the scanning tunneling electron microscope and is described in Physical Review Letters Vol. 49, No. 1, p. 57.

Apparatus for practicing the invention will bear some resemblance to the scanning tunneling microscope apparatus but will differ in that the current is sent through uniformly replenished gas where the electron energy is just above the energy required to change the composition of the gas. The apparatus stylus and substrate holder will have means of providing current between them. The tip of the stylus will be modified to produce the proper current concentration and means will be provided to maintain a gas, the composition of which will change in the current. Under proper conditions where a monolayer molecular layer is adsorbed (of the order of $10^{15}$ cm$^{-2}$) one dissociation molecular event for each 10 electrons may be expected.

Referring to FIG. 1 a schematic illustration is provided for the invention. A substrate 1 on which a fine line 2 is to be formed is in position under a stylus 3. The separation between the stylus 3 and the substrate 1 depends on the stylus radius, the energy of the electrons, and the current. A source of voltage provided by power supply techniques standard in the art is introduced between two terminals 4 and 5 to sustain the current flow between the stylus 3 and the substrate 1. A decomposable molecular gas 6 is maintained in the region between the stylus 3 and the substrate 1. This is accomplished by merely providing an ambient of the gas 6 in the vicinity of the stylus 3. The gas pressure of gas 6 should be high enough to maintain at least a monolayer of molecules of gas 6 on the surface of substrate 1.

The principles involving the required energy are described in connection with FIG. 2.

Figure 2:
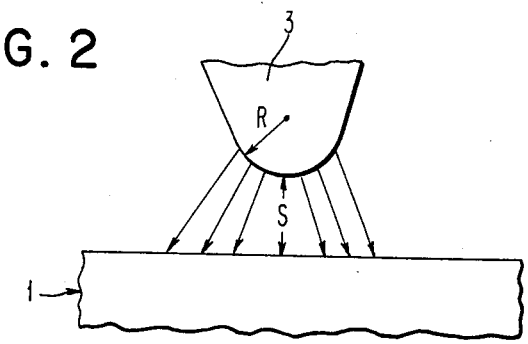
FIG. 2 is a schematic illustration of the current flow at the tip of the stylus in the apparatus of the invention.

Referring next to FIG. 2, a schematic illustration is provided of the details of the current flow at the tip of the stylus 3. The details of the tip of the stylus 3 and the separation from the substrate 1 are of importance in the invention in that the energy involved in decomposing the gas in the quantum mechanical tunneling current is achieved through the radius of the tip and the separation for a given current value.

In order to provide clarity of explanation, the details of the tip and tunneling current will be described in connection with the best mode for carrying out the invention.

BEST MODE FOR CARRYING OUT THE INVENTION

In FIG. 2 the tip of the stylus 3 has a radius labelled R and the tip is separated at its closest point from the substrate 1 by a distance S.

The radius R may, for most applications, be of the order of 10 Angstroms. Tunneling current stylus tips of this size are common practice in the scanning tunneling electron microscope art.

As an ideal goal the radius R could be as small as 1 atomic diameter but at the present state of the art, however, a method of reliably forming a point that is 1 atomic diameter has not been achieved.

The separation distance S would ideally be in the vicinity of 20 Angstroms. The two parameters R and S are related to line width W as shown in Equation 1.

$$W = \sqrt{S(R + S)} \quad \text{Equation 1}$$

The field at the tip of the stylus 3 should be no greater than in the vicinity of $10^7$–$10^8$ volts per centimeter to prevent material decomposition of the tip.

The lowest electron energy should be of the amount of energy necessary to dissociate or change a molecule of the gas 6 with allowance for some system losses.

The highest tolerable electron energy would be governed by substrate backscattering. This higher value however if not limited by line definition should not be so high that sputtering would occur and hence it is necessary to stay below a field where the tip of the stylus 3 comes apart.

The electron energy must be above the energy required to cause the molecules of the gas 6 to dissociate. Since there are different energies for different gases, the chemistry of the gas 6 provides some current flexibility. The gas 6 may decompose and leave as the line 2 a residue or it could merely change so that the line 2 is the product of further processing such as by locally under the tip of the stylus 3 changing a coating on the substrate 1.

Where the gas 6 dissociates to leave a residue 2, the gas 6 should preferably be a large molecular gas, such as trimethylaluminum $Al(CH_3)_3$, tungsten hexafluoride $(WF_6)$, boron $(BF_3)$, trifluoride $W(CO)_6$, disilane $Si_2H_6$, $Ni(CO)_6$ and Arsine $AsH_3$. Each gas has a dissociation energy and the electrons of the field are arranged to closely match the necessary energy.

What has been described is the providing of very fine lines by the changing of the composition of a gas in a tunneling electron current matched to the energy required to dissociate the gas.

Having thus described our invention, what we claim as new and desire to secure by Letters Patent is:

1. Apparatus for forming a line of a material on a substrate comprising in combination a pointed stylus, a substrate, an electric current decomposable gas, means providing current flow between said stylus and said substrate through said gas, means including interdependent voltage, point radius, and point to substrate separation parameters for adjusting said current flow to provide quantum mechanical tunneling at a field energy value essentially matched to the energy required to dissociate the molecules of said gas.

2. The apparatus of claim 1 wherein said adjustment means includes a less than 100 Angstrom stylus point radius, a less than 100 Angstrom stylus point to substrate separation and a field at the tip of the stylus in the range of 3 to 100 electron volts.

3. The apparatus of claim 2 wherein said gas is at least one member of the group of $Al(CH_3)_3$, $WF_6$, $W(CO)_6$, $BF_3$, $Si_2H_6$ and $AsH_3$.

4. In a system for producing a line of a particular material on a substrate using tunneling current, the improvement comprising providing a gaseous compound of said particular material at least in the location of said tunneling current, and matching the energy in the electrons in said tunneling current with the decomposition energy required to dissociate said particular material from said gaseous compound.

* * * * *